United States Patent [19]

Malhi

[11] Patent Number: 5,532,957
[45] Date of Patent: Jul. 2, 1996

[54] FIELD RECONFIGURABLE LOGIC/MEMORY ARRAY

[75] Inventor: Satwinder Malhi, Garland, Tex.

[73] Assignee: Texas Instruments Incorporated, Dallas, Tex.

[21] Appl. No.: 381,180

[22] Filed: Jan. 31, 1995

[51] Int. Cl.$^6$ ................................................. G11C 11/00
[52] U.S. Cl. ............................................ 365/154; 326/38
[58] Field of Search ................................... 365/154, 156; 326/38, 41

[56] References Cited

U.S. PATENT DOCUMENTS

| | | | |
|---|---|---|---|
| 4,233,524 | 11/1980 | Burdick | 326/38 |
| 4,975,601 | 12/1990 | Steele | 326/38 |
| 5,001,368 | 3/1991 | Cliff | 326/38 |
| 5,012,135 | 4/1991 | Kaplinsky | 326/38 |
| 5,146,117 | 9/1992 | Larson | 326/38 |

Primary Examiner—A. Zarabian
Attorney, Agent, or Firm—Jacqueline J. Garner; Jim Brady; Richard L. Donaldson

[57] ABSTRACT

All of the components of a standard logic gate wherein high precision is required, preferably a NAND gate, are provided, preferably in bulk silicon and the remaining components required for a memory cell wherein relatively low precision is required, preferably an SRAM, as well as a mode select circuit are provided, preferably in a polysilicon layer over the bulk silicon. The mode select circuit is design to operate in plural modes, a two mode mode select circuit being the preferred embodiment. In any mode of operation as determined by the mode select circuit, all unused or unrequired circuitry is either isolated from the active portion of the circuit or used to enhance operation of required circuitry, such as, for example, operating in parallel therewith or in series therewith. The polysilicon layer, if used, can be disposed over the bulk silicon with vias and interconnects therebetween. The resulting circuit can require less circuit area required by a similar prior art circuits of both of the configurations obtainable, yet be capable of providing any one of plural selected functions. In addition, the improved hardware utilization is conducive to speed enhancement and lower power utilization due to paralleling.

3 Claims, 1 Drawing Sheet

FIELD RECONFIGURABLE LOGIC/MEMORY ARRAY

BACKGROUND OF THE INVENTION

1. Field of the Invention

This invention relates to circuit which is reconfigurable on-line to perform a function required at that time for a given application and, more specifically, to a circuit which can be reconfigured, on-line, between a logic circuit, such as a two input NAND gate, and a memory cell, such as a static random access memory (SRAM).

2. Brief Description of the Prior Art

At present, integrated circuits are designed and fabricated with hard configured circuitry wherein each individual circuit is fixed by the interconnects on the chip which interconnect the various components on the chip. When the function provided by a particular circuit on the chip is not required for a particular operation, that circuitry and the space on the chip occupied by that circuitry is temporarily wasted. It is therefore readily apparent that a chip in which the circuitry could be reconfigured on-line and provide plural functions would be a significant advance in the art because it would make a chip of given dimension and circuit density available for many more functions than can be provided in prior art circuitry.

SUMMARY OF THE INVENTION

In accordance with the present invention, there is provided an integrated circuit which is reconfigurable on-line and which is capable of providing plural circuit functions with the same chip components. More specifically, in the preferred embodiment, both a two input NAND gate function as well as an SRAM function are provided using some of the same components in conjunction with each of the circuit configurations. In addition, the circuitry can be provided in a stacked configuration wherein some of the circuitry, generally the circuitry requiring high precision is fabricated in a layer of bulk or monocrystalline silicon and some of the circuitry, generally the circuitry requiring low precision is fabricated in a layer of polysilicon thereover with appropriate vias and interconnects from the polysilicon layer to the bulk silicon, thereby providing even greater circuit packing density without any material loss in function capabilities of the chip.

Briefly, the above is accomplished by providing all of the components of a standard logic gate wherein high precision is required, preferably a NAND gate, in bulk silicon and providing the remaining components required for a memory cell wherein relatively low precision is required, preferably an SRAM, as well as a mode select circuit in the polysilicon layer over the bulk silicon. The mode select circuit is design to operate in plural modes, a two mode mode select circuit being the preferred embodiment. In any mode of operation as determined by the mode select circuit, all unused or unrequired circuitry is either isolated from the active portion of the circuit or used to enhance operation of required circuitry, such as, for example, operating in parallel therewith or in series therewith. The resulting circuit can require either less or the same circuit area required by a similar prior art circuit of one of the configurations obtainable, yet be capable of providing any one of plural selected functions. In addition, the improved hardware utilization is conducive to speed enhancement and lower power utilization due to paralleling.

DESCRIPTION OF THE PREFERRED EMBODIMENT

Figure 1:
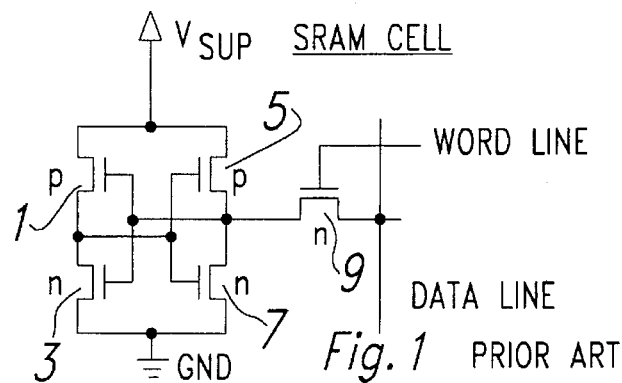
FIG. 1 is a circuit diagram of a typical prior art SRAM cell.

Referring first to FIG. 1, there is shown a circuit diagram of a typical SRAM cell which is basically a cross-coupled latch. The SRAM cell includes a pair of series connected p-channel (1, 5) and n-channel (3, 7) devices connected in parallel between the voltage supply and reference voltage or ground. The gate electrodes of the transistors of each series circuit are connected together and to the junction of the p-channel and n-channel transistors of the other series circuit. A further n-channel pass transistor 9 has a gate electrode coupled to the word line of a memory array, with one source/drain coupled to the data line of the memory array and the other source/drain coupled to the junction of a p-channel transistor 5 and the n-channel transistor 7. When the pass gate 9 is activated by an appropriate positive signal on the word line, the contents of the SRAM are passed through the pass gate to the data line in standard manner.

Figure 2:
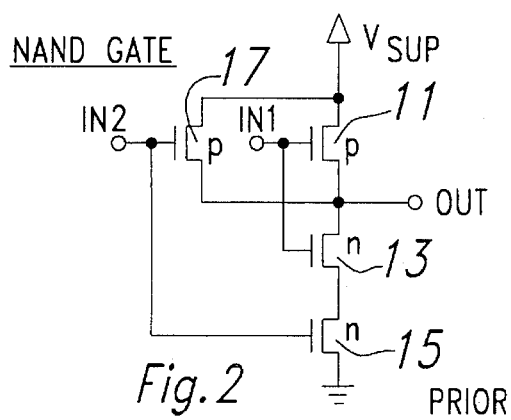
FIG. 2 is a circuit diagram of a typical prior art NAND gate.

Referring now to FIG. 2, there is shown a circuit diagram of a typical NAND gate. The circuit configuration includes a series circuit having a p-channel transistor 11 followed by two n-channel transistors 13, 15 between the voltage supply and ground. A second p-channel transistor 17 is connected in parallel with p-channel transistor 11. The gates of transistors 11 and 13 are connected together and provide a first input to the NAND gate and the gates of transistors 15 and 17 are connected together and provide a second input to the NAND gate with the output of the NAND gate being taken from the junction of transistors 11 and 13.

Figure 3:
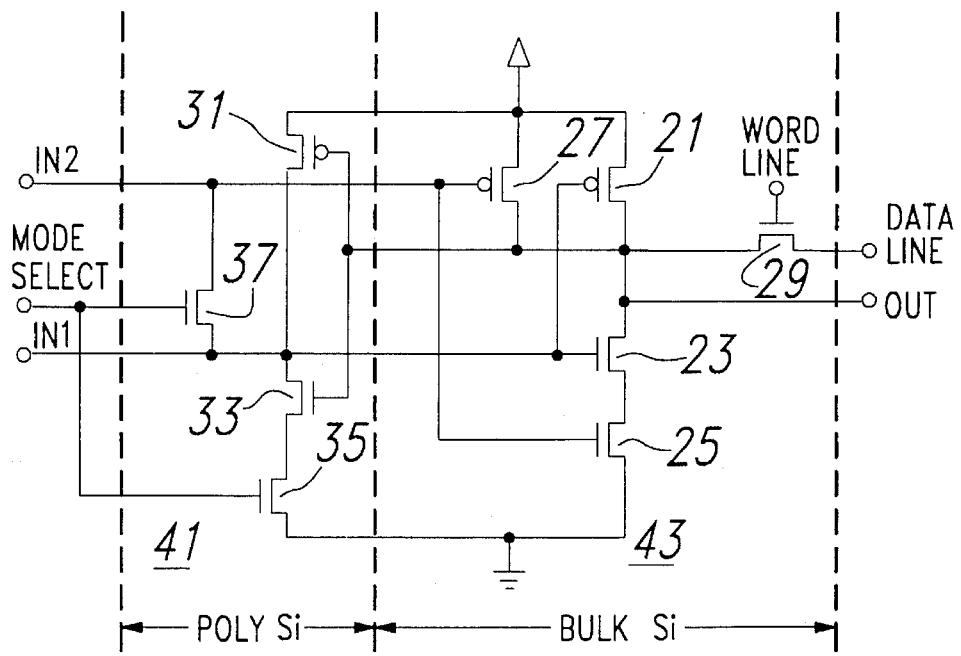
FIG. 3 is a circuit diagram of a reconfigurable circuit capable of providing an SRAM cell or a NAND gate in accordance with the present invention.

Referring now to FIG. 3, there is shown an on-line or field reconfigurable logic/memory circuit in accordance with the present invention which is capable of providing either of the circuits of FIGS. 1 and 2 above by operation of a mode select input. The circuit includes a first series circuit between the voltage supply and ground or reference voltage which includes p-channel transistor 21, n-channel transistor 23 and n-channel transistor 25 which are equivalent to transistors 11,13 and 15 of FIG. 2, a further p-channel transistor 27 is connected in parallel with transistor 21 and is equivalent to transistor 17 of FIG. 2. It can therefore be seen that transistors 21, 23, 25 and 27 provide the NAND gate circuit of FIG. 2. In addition, the circuit of FIG. 3 includes an n-channel transistor 29 coupled to the junction of transistors 21 and 23 which is equivalent to the pass transistor 9 of FIG. 1, a series circuit composed of p-channel transistor 31 and n-channel transistor 33 connected between the voltage supply and ground through a first mode select n-channel transistor 35 and, less transistor 35, is the equivalent of transistors 1 and 3 of FIG. 1. Transistors 21 and 23 are also the equivalent of transistors 5 and 7 of FIG. 1 under conditions as will be explained hereinbelow.

Transistors 35 and 37 are the mode select transistors and determine whether the circuit is to operate as a NAND gate or as an SRAM. Transistor 35 is an n-channel transistor coupled between transistor 33 and ground and isolates transistor 33 from ground when off. Transistor 35 is coupled to the mode select input. Transistor 37 is also an n-channel transistor coupled between the gates of transistors 27 and 23 with its gate also coupled to the mode select input.

In operation, when the mode select input is low, transistors 33 and 35 are off, thereby isolating transistors 31 and 33 from ground and providing a circuit containing only operating or active transistors 21, 23, 25 and 27 with input 1 to the gates of transistors 21 and 23 and input 2 to the gates of transistors 25 and 27, the output being taken from the junction of transistors 21 and 23. It can be seen that this circuit is identical to the circuit of FIG. 2 and provides a NAND gate operation.

When the mode select input is high, transistors 33 and 35 are on. This connects the series circuit including transistors 31 and 33 to ground to activate that portion of the circuit, this being the equivalent of transistors 1 and 3 of FIG. 1. Transistor 37 meanwhile places an effective short circuit across the two input terminals input 1 and input 2 of the NAND gate. This causes the transistors 21 and 27 to be connected together with their gates short circuited together and therefore to act as one device, the equivalent of transistor 5 of FIG. 1. Also, the gates of transistors 23 and 25 are tied together through transistor 37, thereby causing these series connected transistors to operate as a single device equivalent to transistor 7 of FIG. 1. It can therefore be seen that, with the mode select input providing a high voltage signal, the circuit of FIG. 3 will provide the circuit of FIG. 1.

In order to make the circuit of FIG. 3 even more compact, as shown in FIG. 3, the circuit can be layered with a layer of polysilicon 41 disposed over bulk silicon 43. As can be seen, transistors 21, 23, 25, 27 and 29 are fabricated in the bulk silicon 43 whereas the transistors 31, 33, 35 and 37 are fabricated in polysilicon with vias and interconnects therein to interconnect on each layer the voltage supply line, the ground, input lines 1 and 2 and the output line. What has been accomplished is that the transistors which act only as switching devices and need not be of high precision are fabricated in polysilicon whereas devices which require higher precision are fabricated in the bulk silicon. Accordingly, all of the devices required to form the NAND gate are in bulk silicon because a logic operation is involved and higher precision and speed are required whereas, in the case of memory, only the state of the device is of importance and lower precision and speed will suffice.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modification.

I claim:

1. An integrated circuit chip comprising:

a monocrystalline silicon portion on said chip;

a polycrystalline portion on said chip;

a first plurality of of circuit elements on said monocrystalline silicon portion;

a second plurality of circuit elements on said polycrystalline silicon portion; and circuitry for configuring said first and second plurality of circuit elements in a memory cell configuration and for alteratively configuring said first plurality of circuit elements and disabling said second plurality of circuit elements for a logic gate configuration.

2. The chip of claim 1, wherein said logic gate configuration comprises a NAND gate.

3. The chip of claim 1, wherein said memory cell configuration comprises a SRAM cell.

* * * * *